United States Patent
El-Chammas

(10) Patent No.: US 9,831,886 B2
(45) Date of Patent: Nov. 28, 2017

(54) BACKGROUND CALIBRATION FOR DIGITAL-TO-ANALOG CONVERTERS

(71) Applicant: Texas Instruments Incorporated, Dallas, TX (US)

(72) Inventor: Manar Ibrahim El-Chammas, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/978,392

(22) Filed: Dec. 22, 2015

(65) Prior Publication Data

US 2016/0182076 A1    Jun. 23, 2016

Related U.S. Application Data

(60) Provisional application No. 62/096,474, filed on Dec. 23, 2014.

(51) Int. Cl.
*H03M 1/66* (2006.01)
*H03M 1/10* (2006.01)

(52) U.S. Cl.
CPC ....... *H03M 1/1009* (2013.01); *H03M 1/1061* (2013.01); *H03M 1/66* (2013.01); *H03M 1/662* (2013.01)

(58) Field of Classification Search
CPC .... H03M 1/1033; H03M 1/66; H03M 1/1009; H03M 1/74; H03M 1/1061; H03M 1/662
USPC ........................................ 341/120, 121, 144
See application file for complete search history.

(56) References Cited

U.S. PATENT DOCUMENTS

| | | | |
|---|---|---|---|
| 8,125,361 B2* | 2/2012 | Choe | H03M 1/1061 341/120 |
| 8,179,295 B2* | 5/2012 | Ho | H03M 1/1057 341/136 |
| 8,442,461 B2* | 5/2013 | Norimatsu | H04B 1/0483 375/302 |
| 8,493,251 B2* | 7/2013 | Riches | H03M 1/1004 341/120 |
| 9,130,582 B2* | 9/2015 | Cyrusian | H03M 1/0845 |
| 9,136,856 B1* | 9/2015 | El-Chammas | H03M 1/1057 |
| 9,337,860 B1* | 5/2016 | Li | H03M 1/0692 |
| 9,413,383 B1* | 8/2016 | Sharma | H03M 3/384 |

* cited by examiner

Primary Examiner — Brian Young
(74) Attorney, Agent, or Firm — Gregory J. Albin; Charles A. Brill; Frank D. Cimino

(57) ABSTRACT

A system and method where a comparator is operatively coupled to an output of a Digital-to-analog Converter (DAC). The DAC may comprise a single DAC core or a plurality of interleaved DAC cores. The comparator is configured to capture properties of DAC core output. A digital engine is operatively coupled to receive output of the comparator and configured to calculate a cross-correlation between comparator output and input to the DAC core(s). The digital engine may be configured to determine if the skew of each DAC core is positive or negative and to determine if a skew correction term for the DAC core(s) should be decreased or increased, based on the skew of each DAC core being positive or negative, respectively. In interleaved DAC core devices, clock frequency sampling edges of the comparator may alternate between clock edges of each of the interleaved DAC cores.

20 Claims, 6 Drawing Sheets

BACKGROUND CALIBRATION FOR DIGITAL-TO-ANALOG CONVERTERS

CROSS-REFERENCE TO RELATED APPLICATION

The present application claims the benefit of the filing date of of U.S. Provisional Patent Application Ser. No. 62/096,474, entitled Background Calibration for DACs, filed Dec. 23, 2014, which is incorporated herein in its entirety by reference.

TECHNICAL FIELD

Aspects of this disclosure are directed, in general, to Digital-to-analog Converters (DACs) and, more specifically, to background calibration for DACs.

BACKGROUND

DACs, particularly, multi-channel DAC integrated circuits (ICs) are used in cellular base stations, diversity transmit applications, wideband communications, Direct Digital Synthesis (DDS) instruments, millimeter/microwave backhaul applications, automated test equipment, cable infrastructure, distance measurement, and the like. In time-interleaved multi-channel DACs, there is often skew between the DAC channels. This affects SFDR and other AC performance metrics, and becomes more problematic at higher signal frequencies. Also, in a single DAC that suffers from periodic glitches on the supplies, such as glitches on the DAC clock, or the like, if the frequency of such glitches is smaller than that of the DAC (e.g. half, one-quarter, etc. of the DAC data rate (i.e., FS/2, FS/4, etc., where FS is the DAC Full Scale data rate)), the effect of the glitches is analogous to that of skew, such as discussed with respect to interleaved DACs.

SUMMARY

Aspects of the disclosure provide for capturing, by a comparator coupled to an output of a Digital-to-analog Converter (DAC), properties of output from the DAC. A digital engine coupled to an output of the comparator receives output of the comparator and the digital engine calculates cross-correlation between comparator output and input to the DAC.

Hence, in accordance with aspects of the present systems and methods, an apparatus may comprise a DAC, and a comparator operatively coupled to an output of the DAC. This comparator is configured to capture properties of the DAC's output, and a digital engine is operatively coupled to receive output of the comparator and configured to calculate a cross-correlation between the comparator output and the input to the DAC.

Thus, in accordance with aspects of the present systems and methods, a system may comprise a DAC to which a digital signal source is coupled, via an input. A comparator is operatively coupled to an output of the DAC, wherein the comparator is configured to capture properties of the DAC. A digital engine is operatively coupled to receive output of the comparator, configured to monitor the input from the digital signal source to the DAC, and configured to calculate cross-correlation between comparator output and the input to the DAC.

In accordance with various aspects of the present systems and methods, the DAC may comprise a plurality of interleaved DAC cores, and the comparator may be operatively coupled to the outputs of the plurality of interleaved DAC cores. Therein, the digital engine may calculate cross-correlation between comparator output for each of the interleaved DAC cores and a respective input to each of the interleaved DAC cores and determine if a skew of each interleaved DAC core is positive or negative.

Calculating the cross-correlation between the comparator output and the input to the DAC or DAC cores may include calculating skew direction information for the output of the DAC or DAC cores and determining if the skew of the DAC or each DAC core is positive or negative is determined relative to a reference point.

In accordance with various aspects of the present systems and methods, a determination may be made whether a skew correction term for each DAC or DAC core should be decreased or increased, based on the skew of the respective DAC or DAC core being positive or negative, respectively.

A clock frequency for the comparator may be provided from a full scale clock employed by the DAC or DAC cores and/or clock frequency sampling edges of a clock of the comparator may alternate between clock edges of each DAC core.

DAC or DAC core output skew may be corrected in accordance with various aspects of the present systems and methods using a capacitive DAC operatively coupled to a clock input of the DAC by delaying DAC or DAC core clock signals in response to calculated cross-correlation between comparator output and input to the DAC or DAC cores and/or digitally corrected through feedback from the digital engine to digital word generation and/or the digital signal source.

BRIEF DESCRIPTION OF THE DRAWINGS

Figure 1:
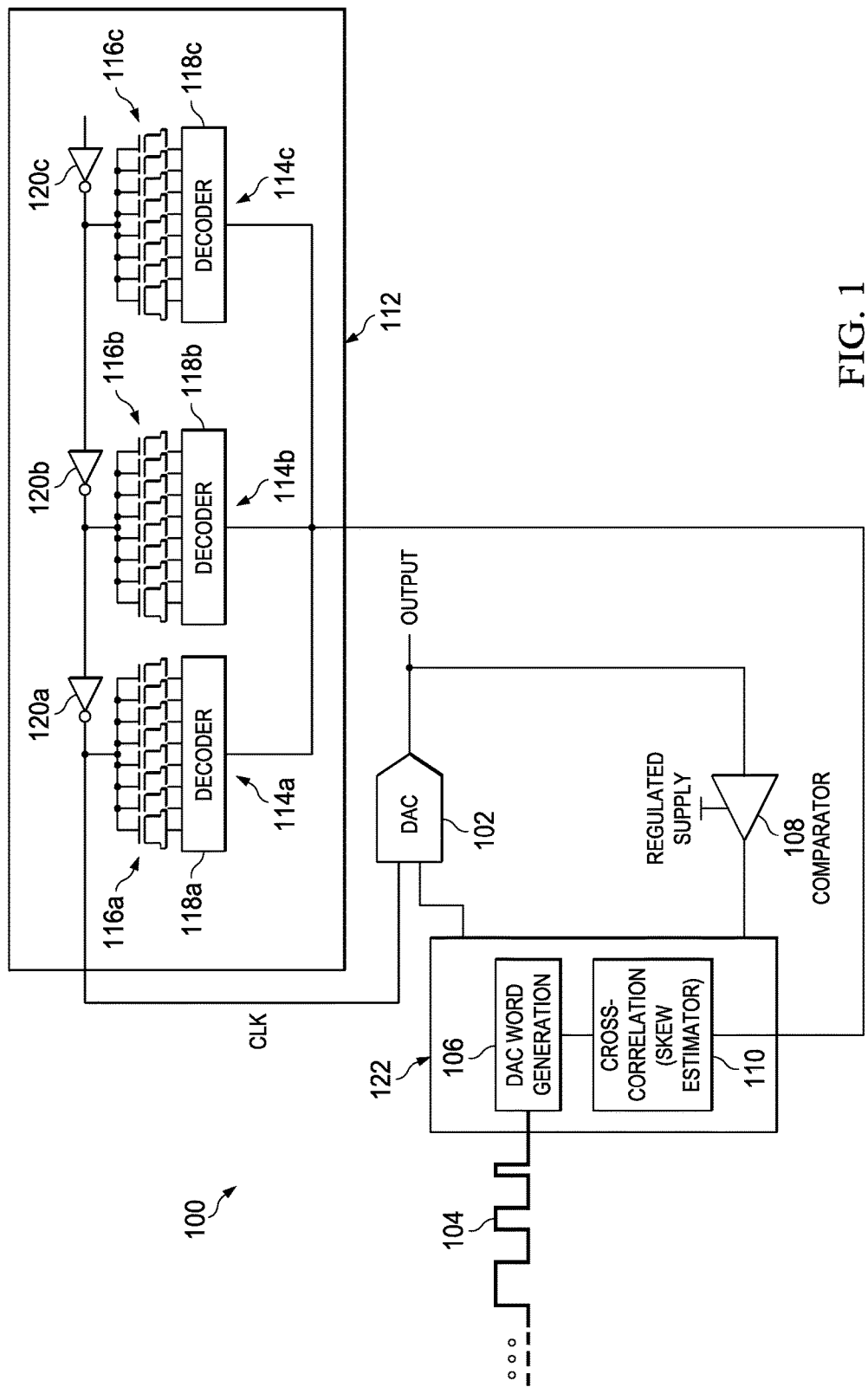
Figure 2:
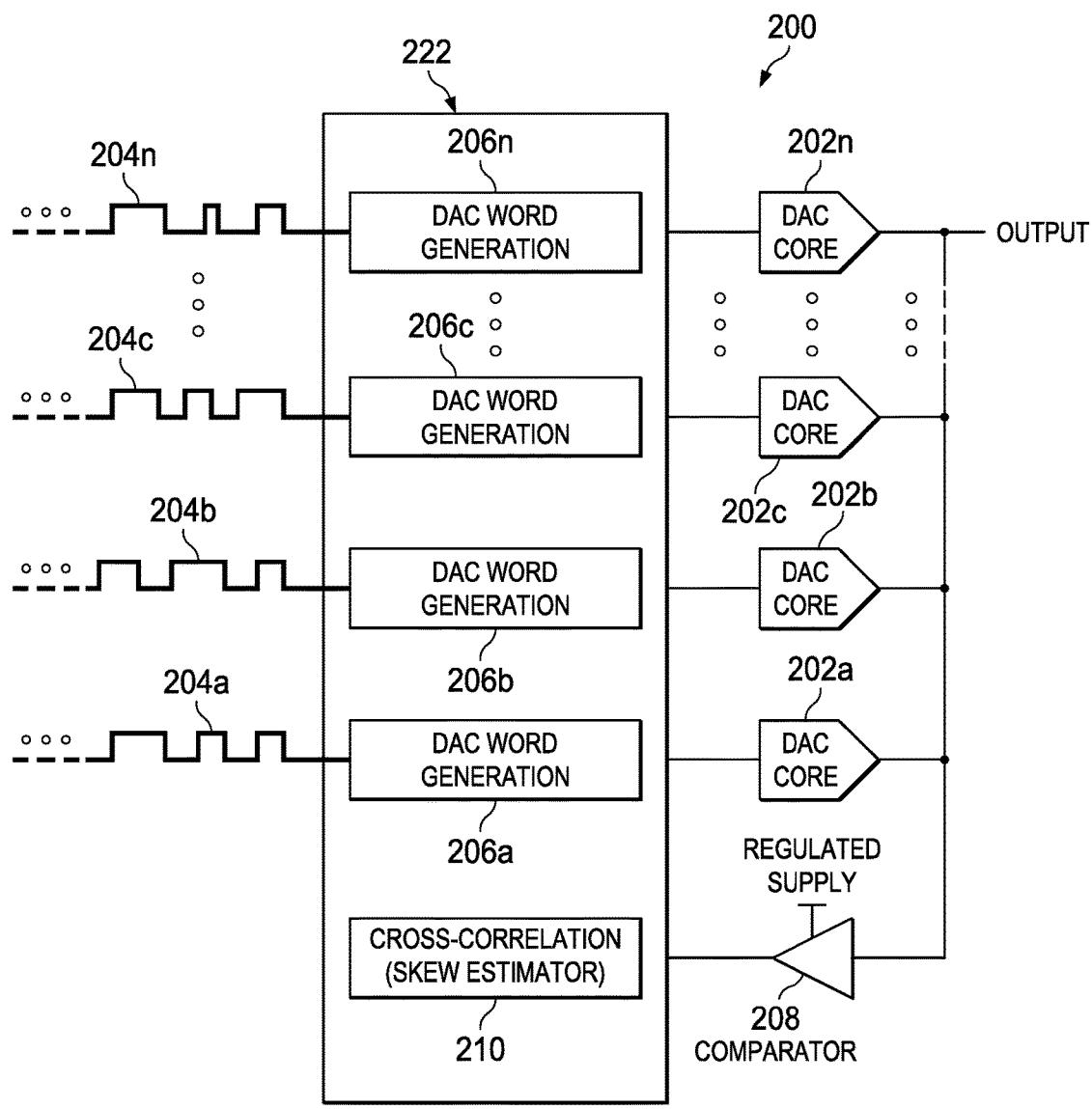
Figure 3:
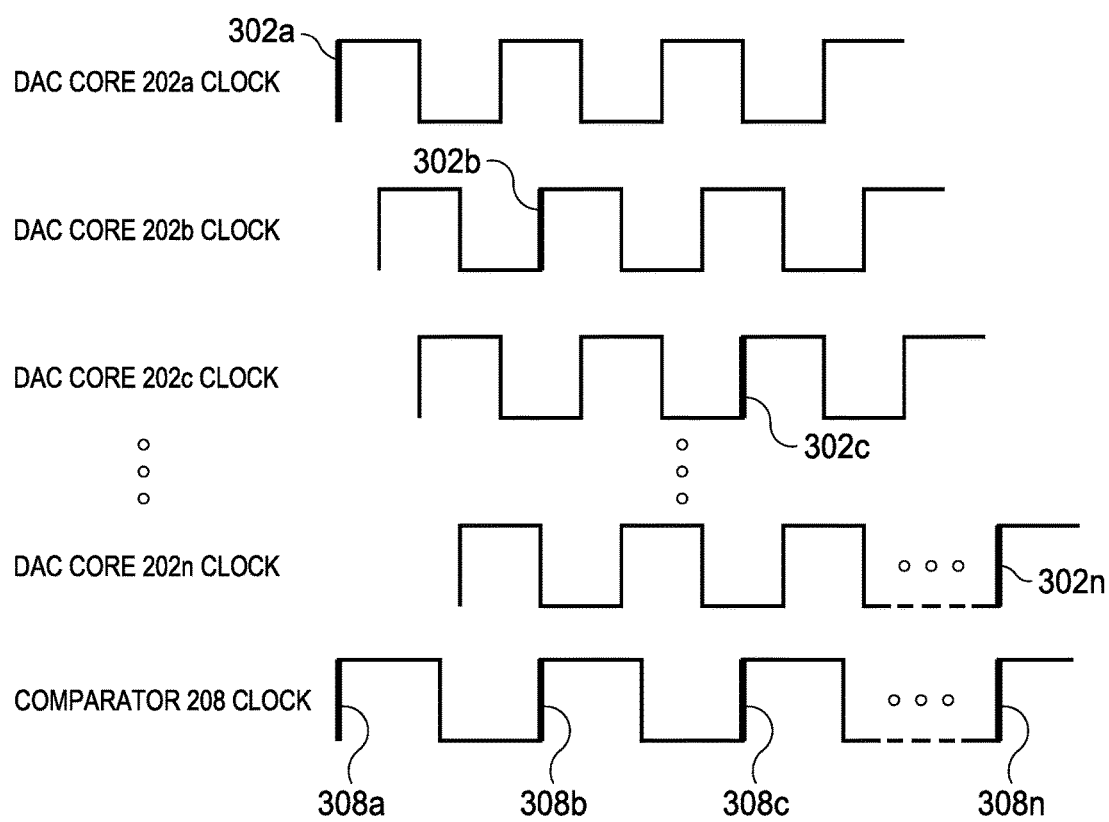
Figure 4:
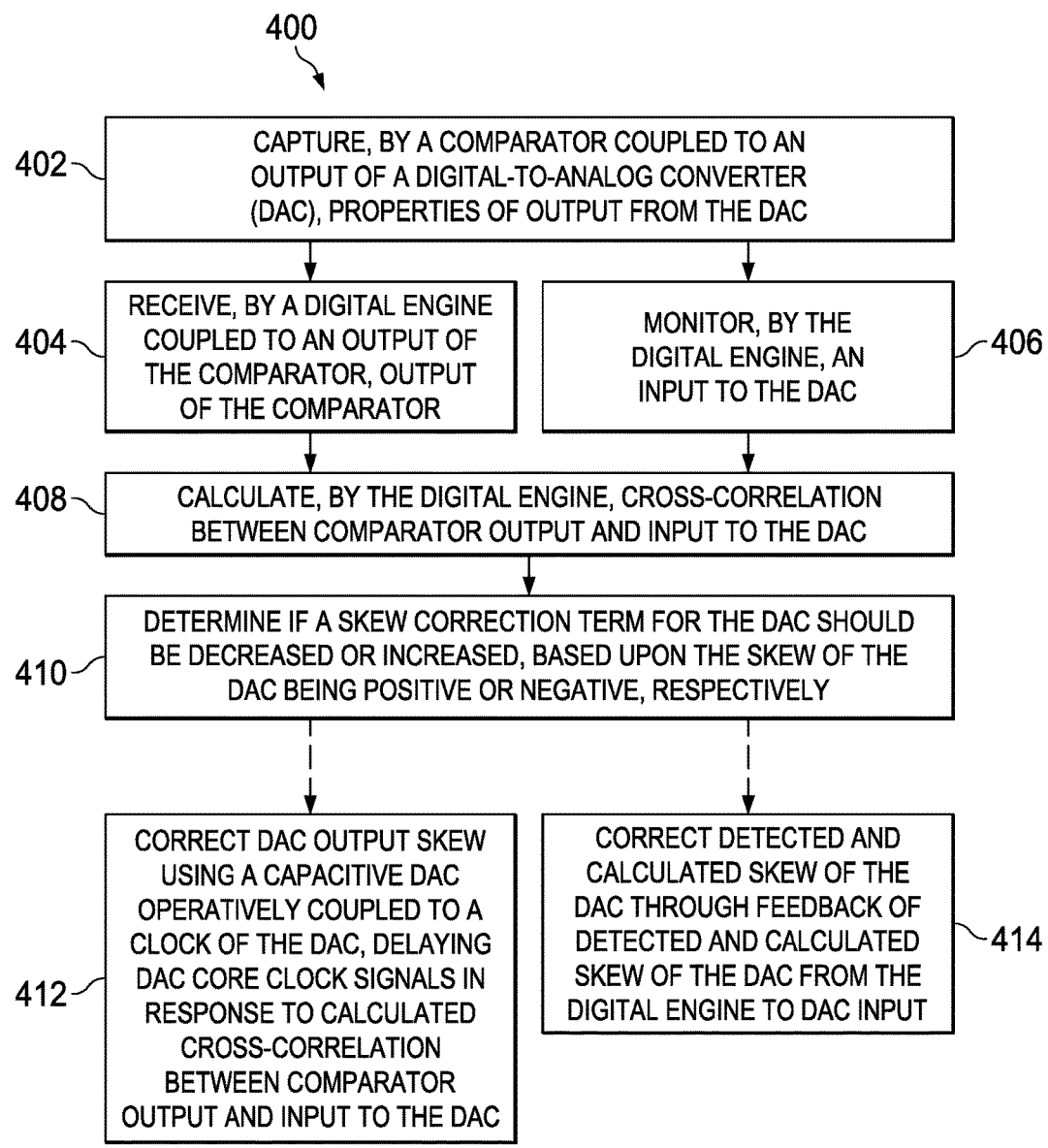
Figure 5:
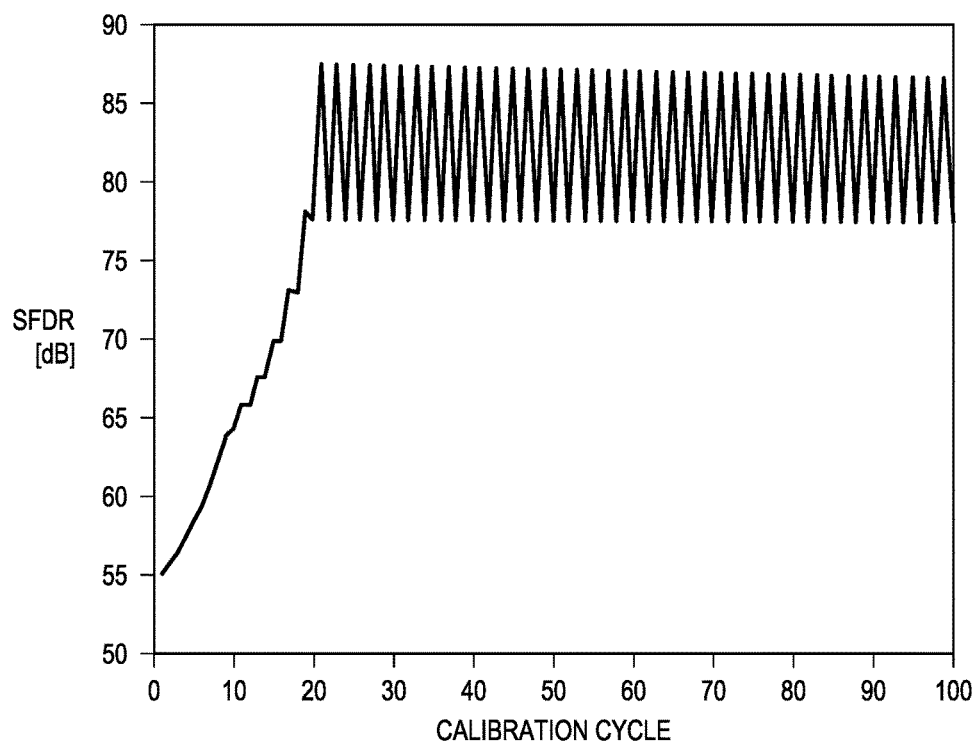
Figure 6:
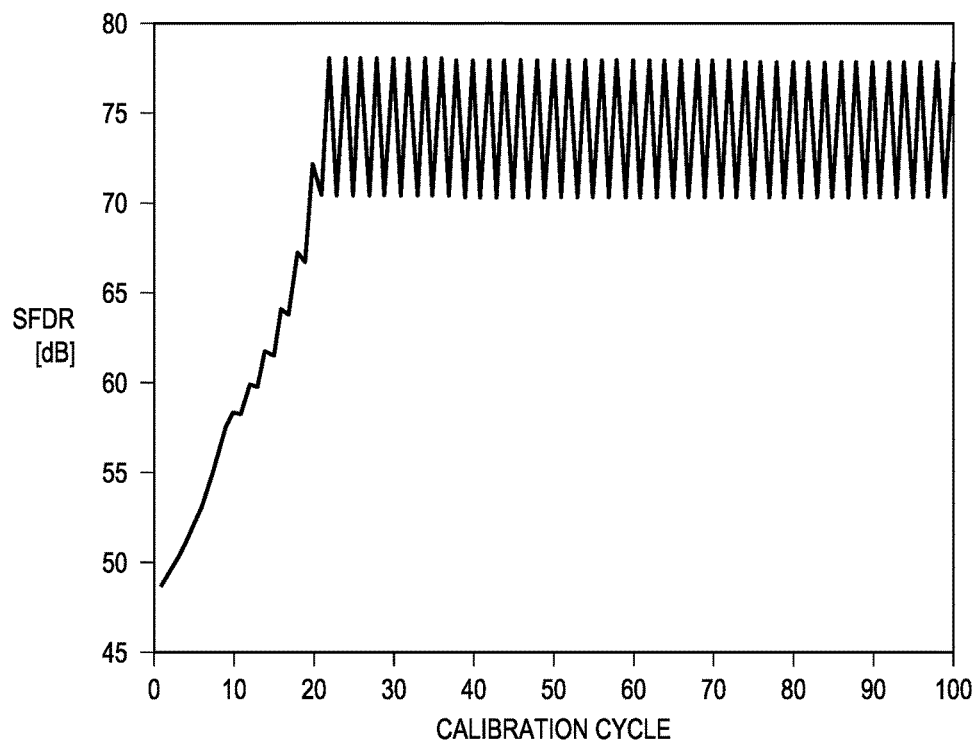
Figure 7:
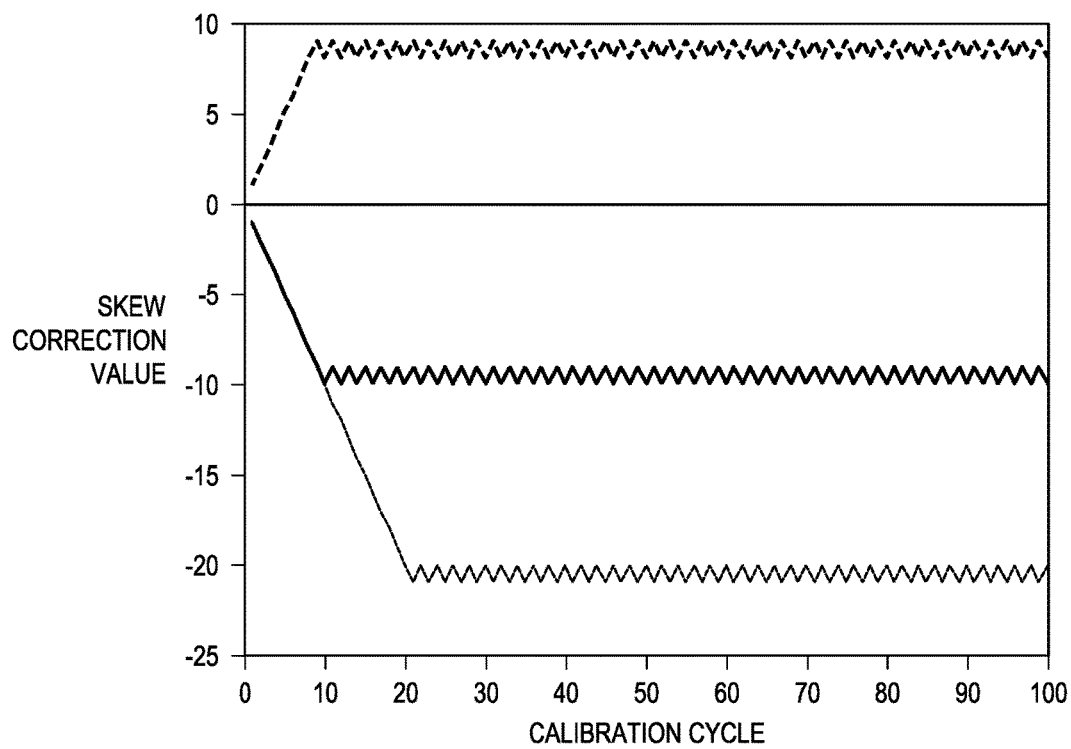
Figure 8:
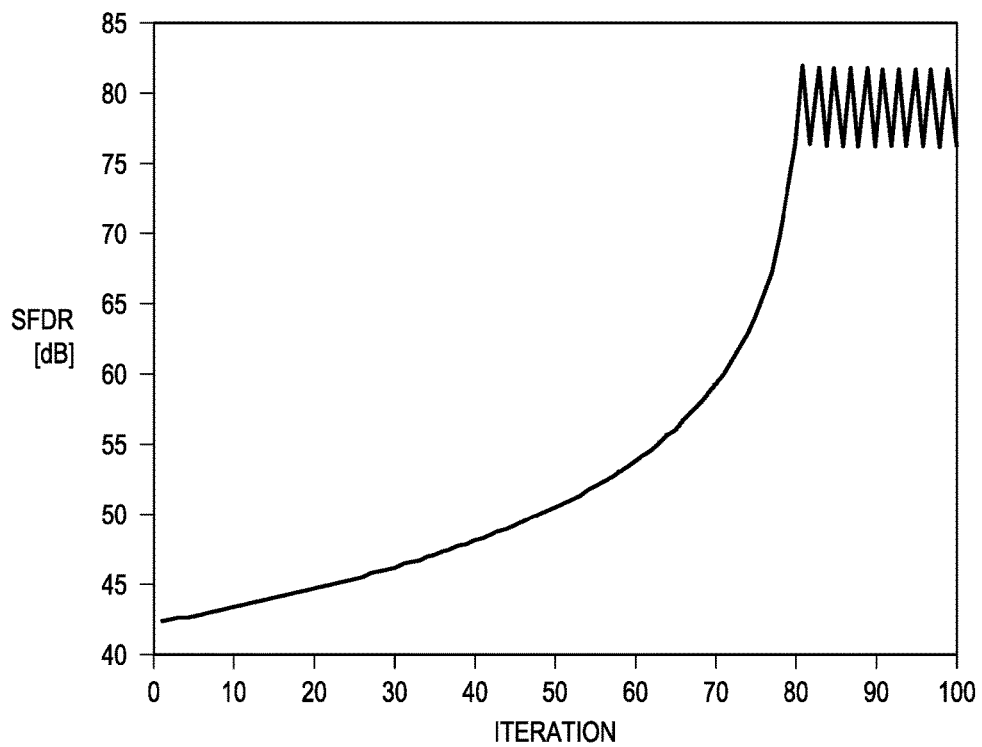

Having thus described the present systems and methods in general terms, reference will now be made to the accompanying drawings, wherein:

FIG. 1 is a block diagram of an example system employing an example of the present systems and methods for background calibration of Digital-to-analog Converters (DACs), according to some embodiments;

FIG. 2 is a block diagram of an example of a portion of a DAC apparatus showing a plurality of interleaved DAC cores employing an example of the present systems and methods for background calibration, according to some embodiments;

FIG. 3 is an illustration of example timing of the clocks of interleaved DAC cores and the clock of a comparator, according to some embodiments;

FIG. 4 is a flowchart of an example implementation for background calibration of DACs, in accordance with some embodiments;

FIG. 5 is an example graph of Spurious-Free Dynamic Range (SFDR) over a number of calibration cycles in accordance to some embodiments of the present systems and methods, in a four-way interleaved DAC device that outputs an approximately FS/8 signal;

FIG. 6 is an example graph of SFDR over a number of calibration cycles in accordance to some embodiments of the present systems and methods, in a four-way interleaved DAC device that outputs an approximately FS/4 signal with the same skew values as in FIG. 5;

FIG. 7 graphs example skew correction values (codes) used for for skew correction of a four-way interleaved DAC device in accordance with the example results graphed in FIG. 6; and FIG. 8 is an example graph of an example of SFDR over a number of calibration iterations, in accordance to some embodiments of the present systems and methods in a DAC device that outputs an approximately FS/8 signal, with an FS/2 spur.

DETAILED DESCRIPTION

The techniques of this disclosure now will be described more fully hereinafter with reference to the accompanying drawings. These techniques may, however, be embodied in many different forms and should not be construed as limited to the embodiments set forth herein. Rather, these embodiments are provided so that this disclosure will be thorough and complete, and will fully convey the scope of this disclosure to those skilled in the art. One skilled in the art may be able to use the various embodiments described herein.

The present systems and methods are directed, in general, to Digital-to-analog Converters (DACs) and/or Analog-to-Digital Converters (ADCs), more specifically, to background calibration for DACs or ADCs. To this end, the present systems and methods integrate an n-bit feedback path, via a comparator, a digital engine that estimates error, and a correction block that is implemented in either the digital or the analog domain to provide background calibration for DACs or ADCs. As discussed and illustrated herein, embodiments of the present systems and methods may integrate a 1-bit feedback path with respect to one or more DACs. This 1-bit feedback path (with just a single comparator) may decrease loading on a DAC's output, as discussed in greater detail below. In accordance with embodiments of the present systems and methods, a comparator is operatively coupled to an output of a DAC. The comparator is configured to capture properties of DAC output. A digital engine is operatively couple to receive output of the comparator and configured to calculate a cross-correlation between a comparator output and an input to the DAC. The digital engine may be configured to determine if the skew of the DAC is positive or negative and to determine if a skew correction term for each DAC should be decreased or increased, based on the skew of the DAC being positive or negative, respectively.

The DAC may comprise a plurality of interleaved DAC cores and in such interleaved DAC devices, clock frequency sampling edges of the comparator may alternate between clock edges of each of the interleaved DAC cores. Alternatively, a comparator clock may be provided through a fractional Phase-Locked Loop (PLL), or other divider structure.

Regardless, the resultant systems and methods allow the use of a low resolution feedback path which enable constant calibration. That is, the present systems and methods employ a feedback path, using a 1-bit comparator, to provide background calibration which allows ambient changes to be tracked while the DAC device is in operation.

FIG. 1 is a block diagram of example system 100 employing an example of the present systems and methods for background calibration of DACs, according to some embodiments. In system 100, DAC 102 is coupled to digital signal source 104. That is, an input of the DAC 102 is coupled to the digital signal source such that a DAC word is generated. For example, illustrated DAC word generation block 106 may be employed in a DAC Integrated Circuit (IC) to generate a DAC word for input to DAC 102. DAC 102 may be a single DAC (i.e., single-core DAC) or an interleaved, or time-interleaved, DAC with a plurality of time-interleaved DAC cores (such as discussed below with reference to FIGS. 2 and 3). A single core DAC may have a supply glitch, or the like, such as glitches on the DAC clock, or the like.

In accordance with embodiments of the present systems and methods, comparator 108 is operatively coupled to an output of the DAC. Comparator 108 is configured to capture properties of the DAC output. For example, the comparator may be configured to capture the zero-crossing behavior of the DAC output, such as in a signum function of the DAC, which may, as a result, provide zero-crossing detection. Assuming the comparator clock being constant, if the DAC clock crosses zero early, the comparator output will be different than if the DAC clock is at the right value time instant. Comparator 108 may comprise one or more transistor-based amplifiers and/or latches having a regulated digital current/voltage supply (e.g. sense-amplifier based latches). In some examples, comparator 108 may be a clocked comparator, a dynamic comparator, and/or a latched comparator.

A cross-correlation skew estimating digital engine 110 is operatively coupled to receive an output of the comparator, is configured to monitor the input from digital signal source 104 to DAC 102, and is configured to calculate a cross-correlation between the output of comparator 108 and the input to DAC 102 (from digital signal source 104 and/or digital word generation 106). This digital engine and interconnected components are generally indicated as cross-correlation block 110 in FIG. 1. This digital engine and/or cross-correlation block may be considered an estimation engine, background calibration engine, or the like, where the "engine" may be a processor, processing unit, IC "backend," and/or similar functionality.

Digital engine 110 may be configured to determine if the skew of the DAC is positive or negative and to determine if a skew correction term for the DAC should be decreased or increased, based on the skew the DAC being positive or negative, respectively. Digital engine 110 may, in accordance with embodiments of the present systems and methods decimate the DAC input (a digital word) and the comparator output into one or more streams (which may correspond to the number of interleaved DAC cores). Digital engine 110 calculates the cross-correlation between the DAC input and the comparator output (for each of the streams). If there is no skew, the values of this cross-correlation will be equal (once noise is averaged, as discussed below). If they are not, then skew exists, and this directional information can be used for correction.

The skew may be corrected with the cross-correlation information. One way is to introduce variable delay block 112 which may be implemented as a capacitive DAC. Variable delay block 112 may delay (interleaved) DAC core clock signals. Variable delay block 112 may be coupled to a clock signal (CLK) provided to DAC 102, such that variable delay block 112 may adjust clock signals to DAC 102, by varying the delay in DAC 102, and hence is configured to correct DAC output skew in the analog domain by delaying DAC core clock signals, in response to a digital engine calculated cross-correlation between comparator 108 output and input to the DAC (i.e., input 104 or output of DAC word generation 106). The capacitive load takes as inputs, trim bits from digital engine 110, which are adjusted in order to minimize the skew based on the cross-correlation information. This adjusts the DAC clock edge as needed. In the illustrated example, variable delay block 112 provides a variable capacitive load at the output of delay cells 114*a*, 114*b* and 114*c*, employing the illustrated respective MOS transistor groups 116a, 116b and 116c. Shorting the drain and source nodes of selected transistors and digitally controlling this shorted node, such as by respective decoder 118a, 118b and 118c in response to trim bits supplied from digital engine 110, changes the value of the gate capacitance and delay of corresponding inverters 120a, 120b and 120c, which are loaded with the gate of the respective transistor. The illustrated array of such digitally controlled transistor groups results in a digitally controlled capacitive load. As such, variable delay block 112 may delay an input clock signal (e.g., a clock signal received by inverter 120c) by a variable amount of delay that is determined based on the trim bits provided by cross-correlation block 110, and the trim bits may be determined based on a cross-correlation between the output of comparator 108 and the input to a respective one of one or more DAC cores included in DAC 102.

Alternatively (or additionally), Quadrature Modulator Correction (QMC) functionality, Group Delay Correction (QDC) functionality, or the like, applied to digital word generation 106 (and/or digital signal source 104) as a part of correction block 122, may correct detected and calculated skew of DAC 102, in the digital domain.

Hence, consistent with the foregoing, the present systems and methods may provide a background calibration approach that does not require more than a single comparator to be attached to the output of the DAC, such as shown in FIG. 1. The comparator is a clocked comparator, which samples the DAC output and has a large aperture bandwidth. Hence, the comparator may take advantage of a narrow impulse response function, so as to capture certain properties of the DAC output. That is, the comparator aperture bandwidth is, in accordance with the present systems and methods, larger than the output bandwidth of the DAC. Hence, the comparator has a narrow impulse response function relative to an output response of the DAC.

FIG. 2 is a block diagram of an example of a portion of an interleaved DAC apparatus 200, such as an IC DAC device, employing an example of the present systems and methods for background calibration, according to some embodiments. Therein, a plurality of interleaved DAC cores 202a, 202b, 202c . . . 202n, are shown (and may be referred to herein generally as DAC core(s) 202). This collection of DAC cores in FIG. 2 may be an example of an interleaved or time-interleaved DAC (such as mention with respect to DAC 102 of system 100, above). Digital signal input to DAC cores 202 is provided by a one or more digital signal source inputs 204a, 204b, 204c . . . 204n, such as via DAC IC word generation functionality 206a, 206b, 206c . . . 206n.

Single comparator 208 is operatively coupled to an output of each of DAC cores 202a, 202b, 202c . . . 202n. Comparator 208 is configured to capture properties of the DAC core outputs. For example, the comparator may be configured to capture the zero-crossing behavior of the output of each DAC core, such as may be exhibited in a signum function of each DAC core, which may provide zero-crossing detection. With the comparator clock being constant, if the DAC clock of each core crosses zero early, the comparator output will be different than if the DAC core clock is at the right value time instant. Comparator 208 is further configured to provide the resulting information to cross-correlation skew estimating digital engine digital engine 210, which is operatively couple to comparator 208 to receive this comparator output. The comparator output information may take the form of a single bit representing zero-crossing information, sent as comparator output to digital engine 210. Illustrated cross-correlation block 210 may include a digital engine and interrelated components providing functionality discussed below. Comparator 208 may include one or more transistor-based amplifiers/latches having a regulated digital current/voltage supply (e.g. a sense-amplifier based latch). In accordance with various embodiments of the present systems and methods, comparator 208 may have a narrow impulse response function (i.e. be relatively sensitive). In alternative embodiments, apparatuses may employ a plurality of DAC core-corresponding comparators and/or a plurality of DAC/comparator-corresponding digital engines. In accordance with various embodiments of the present systems and methods, a clock frequency for comparator 208 may be provided, and/or otherwise derived from a Full Scale (FS) clock of the apparatus (IC) 200. In such embodiments, each DAC core clock may be a fraction of FS, FS/N (where "N" is the number of DAC cores) such that the total throughput of the apparatus is FS (full scale). Also, in accordance with various embodiments clock frequency sampling edges of the comparator clock may alternate between clock edges of each of the interleaved DAC cores. Also, although the clock used by the feedback path can be noisy, which can be dealt with by averaging, the present systems and methods may benefit by the clocks deterministic variations being minimized. Hence, other frequencies are acceptable, as long as the sampling edge of the comparator alternates between the clock edges of the interleaved DAC cores. This is best seen with reference to FIG. 3, which illustrates this for four interleaved DAC cores.

FIG. 3 is an illustration of timing of the clocks of DAC cores 202a, 202b, 202c . . . 202n and clock (308) of comparator 208, according to some embodiments. Therein, it is shown how timing of the comparator clock alternates between clock edges of each of the interleaved digital-to-analog converter cores. The clocking edge of the comparator (the rising edge in the illustrated example) coincides with the DAC's (rising) clocking edges. With interleaved DAC cores, as illustrated, the period of the comparator clock can be set such that the rising edge first coincides with the first DAC core, then the second DAC core, then the third DAC core, etc., in a round-robin fashion. This timing allows the cross-correlation block 210 (i.e. the digital engine and interconnected components) to calculate statistics between comparator 208 and each of the DAC cores (202a, 202b, 202c . . . 202n). An FS clock can either be generated off chip or on-chip, such as through use of a PLL, but a lower rate clock can be generated on-chip with a clock generator PLL or with other divider structures, depending on the available on-chip clock signals. Regardless, the timing structure illustrated in FIG. 3 enables cycling through and calculating cross-correlation for each DAC core in such a manner that the comparator is clocked such that its leading sampling edges form a timing grid that match leading sampling points of each DAC core, thus serving as a timing reference. This may be achieved by choosing a calibration frequency that is a proportion of the time-interleaved DAC's sample rate. FIG. 3 shows an example of such a timing grid, illustrating how the comparator cycles through all the DACs, with an interleaving factor of four, in this case, such that the comparator clock has a frequency where first sampling edge 308a coincides with sampling edge 302a of first DAC core 202a, second comparator clock sampling edge 308b coincides with sampling edge 302b of second DAC core 202b, comparator clock third sampling edge 308c coincides with sampling edge 302c of third DAC core 202c and so on for all IC DACs to last sampling edge 308n coinciding with sampling edge 302n of last DAC core 202n. This allows digital engine 210 to calculate the cross-correlation between each DAC and comparator 208.

Returning to FIG. 2, the output of comparator 208 is sent to digital engine 210, which calculates the cross-correlation between the comparator output and the DAC input word(s). Conflicts of the output of comparator 208 for each DAC core 202 are avoided through implementation of the comparator clock interleaving between each of the DAC cores, as discussed above with respect to FIG. 3. Further, this timing allows the comparator/digital engine feedback path to operate at the DAC apparatus' output rate. Since a single comparator is employed, the loading on DAC output nodes is minimal. The outputs of DAC cores 202a, 202b, 202c . . . 202n are all tied together as an input to comparator 208. In a current output DAC IC there is no contention in that a sum of the currents are directed into a resistor in such ICs.

This path provides a timing reference that is used to calibrate DAC skew. Skew directional information is calculated from the estimated cross-correlation, such that the engine can determine if the skew of each interleaved DAC core is positive or negative (relative to a reference point), and thus knows if the skew correction term should be decreased or increased, respectively, for each DAC core. Hence, digital engine 210 also monitors input to the DAC, such as through monitoring of DAC IC word generation functionality 206a, 206b, 206c . . . 206n. This digital estimator decimates the DAC input (a digital word) and the comparator output into N streams. The value of N corresponds to how many interleaved DAC cores exist (or to the value of FS/N if a periodic spur of a single DAC (core) is being calibrated, such as discussed with respect to FIG. 1, above). The cross-correlation between the DAC input and the comparator output is calculated for each of the N streams. That is, digital engine 210 is configured to calculate cross-correlation between output of comparator 208 and input to respective DAC cores 202a, 202b, 202c . . . 202n, individually. If there is no skew, the value of this cross-correlation will be equal (once noise is averaged, as discussed below). If they are not, then skew exists, and this directional information can be used for correction. In particular, digital engine 210 is configured to calculate skew direction information for the outputs of each of DAC cores 202. For example, digital engine 210 may be configured to determine if the skew of each interleaved DAC core 202a, 202b, 202c . . . 202n is positive or negative, such as relative to a reference point. Further, digital engine 210 may be configured to determine if a skew correction term for each corresponding DAC core, 202a, 202b, 202c . . . 202n is to be decreased or increased, based on the skew of that DAC core being positive or negative, respectively. That is, if the skew of a DAC core is positive the the skew correction term for that DAC will be decreased and if the skew for that DAC core is negative the skew correction term will be increased.

Correction can be implemented in the digital domain or the analog domain. In the digital domain, adjustment of the DAC input word counteracts the effect of skew on the DAC output. For example, QMC, QDC, or the like, may correct detected and calculated skew of each of DAC cores 202a, 202b, 202c . . . 202n. To such end, digital engine 210 may feedback QMC, QDC, or the like, to each respective digital word generation block 106a, 106b, 106c . . . 106n (and/or out to a source of the respective digital signal being converted) as a part of correction block 222. Alternatively (or additionally) in the analog domain, the timing can be adjusted using a capacitive DACs. Capacitive DACs may be employed to provide a variable capacitive load on the clock of each DAC core (202a, 202b, 202c . . . 202n) such as through use of an array of such digitally controlled transistors, as discussed above with respect to FIG. 1, for each DAC core.

As noted, in the FIG. 2 illustrated example, the outputs of DAC cores 202a, 202b, 202c . . . 202n are all tied together as an input to comparator 208 and in a current output DAC IC there is no contention in that a sum of the currents are directed into a resistor in such ICs. However, in alternative embodiments the outputs of DAC cores 202a, 202b, 202c . . . 202n may be multiplexed as an input to comparator 208, rather than tied together. Depending on the implementation of an output multiplexer used in such an embodiment, the multiplexer may be controlled by a clock signal to select each DAC core in succession, in which case a multiplexer control signal may create a skew issue (rather than a DAC input clock). In such a case, an embodiment of the present skew calibration approach may be used to correct the multiplexer clock.

FIG. 4 is a flowchart of example implementation 400 for background calibration of DACs, in accordance with some embodiments. Therein, a comparator (108, 208) coupled to an output of a DAC or DAC cores (102, 202) captures properties of the output from this DAC or these DAC cores, at 402. This comparator may, in accordance with embodiments of the present systems and methods and as discussed above, have a narrow impulse function and the clock frequency provided to the comparator may be from an FS clock provided to the DAC or DAC cores. As also discussed above (with respect to FIG. 3) in embodiments having a plurality of interleaved DAC cores, clock frequency sampling edges of a clock of the comparator may alternate between clock edges of each of the interleaved DAC cores.

At 404, a digital engine (110, 210), or the like, as described above, coupled to an output of the comparator receives an output of the comparator. The digital engine, or the like, at 406, also (concomitantly) monitors an input to the DAC or DAC cores. At 408, the digital engine calculates a cross-correlation between comparator output and input to the DAC or each of the DAC cores. In some examples, the cross-correlation may be calculated based on the following equations:

$$f_1 = \sum_{n=1}^{N} x_1[n] * y[n] \qquad \text{Eq. 1}$$

$$f_2 = \sum_{n=1}^{N} x_2[n] * y[n] \qquad \text{Eq. 2}$$

where $f_1$ represents the cross-correlation for a first DAC (core), $f_2$ represents the cross-correlation for a second DAC (core), $x_1[n]$ is the first DAC (core) input, $x_2[n]$ is the second DAC (core) input and $y[n]$ is the comparator output. The comparator output $y[n]$ is:

$$y[n]=y(nT)=sgn(OUTPUT(nT+\tau)) \qquad \text{Eq. 3}$$

where OUTPUT is the output waveform of the DAC (cores), T is the comparator period, and $\tau$ is the DAC (core) clock (clk) skew.

This cross-correlation is performed over a finite time-frame, such as in terms of number of samples. The longer the time-frame, the more noise and estimation variances decrease. The shorter the time-frame, the more ambient changes (voltage, temperature) the digital engine can capture. The cross-correlation calculation between the comparator output and the input to the DAC or DAC cores may include calculating skew direction information for the output of the DAC or each of the DAC cores. For example, if the calculated cross-correlation for one DAC core is larger than that for another DAC core this means the skew for the first DAC core (when compared to a comparator clock) is smaller than the skew for the other DAC core. So, the delay cell for the first DAC core is adjusted such that the skew becomes larger. This adjustment is the the skew directional information and thus is a function of a relative cross-correlation value, between the first DAC core and the second DAC core, in this example.

Thus, in an interleaved DAC IC having a plurality of interleaved DAC cores, the comparator is operatively coupled to the output of each of the plurality of interleaved DAC cores. Therein, calculating the cross-correlation between comparator output and input to the DACs by the digital engine may include calculating a cross-correlation between comparator output for each of the interleaved DAC cores and a respective input to each of the interleaved DAC cores. As noted above, in current output DACs, coupling the DAC core outputs does not result in bus contention. However, in alternative embodiments the DAC core outputs may be multiplexed, as also discussed above.

Calculating the cross-correlation between comparator output and input to the DAC or DAC cores by the digital engine may also include determining if the skew of the DAC or each DAC core is positive or negative, such as relative to a reference point. In the case of non-interleaved (single core) DACs, the 0th sample (out of N samples) can be taken as this reference point. In interleaved DACs, the reference point may be a DAC0 clock such that skew of each interleaved DAC core (e.g. each of DAC cores 202*a*, 202*b*, 202*c* . . . 202*n*) is relative to this DAC0 clock. Thus, if the calculated cross-correlation between the comparator and a DAC core is larger or smaller than the cross-correlation between DAC0 and the comparator, the digital engine may make the skew correspondingly smaller or larger in accordance with the present systems and methods for background calibration.

In accordance with various implementations of the present systems and methods, a determination may be made at 410, such as by the digital engine, whether a skew correction term for each DAC should be decreased or increased, based on the skew of the respective DAC being positive or negative, respectively. That is, if $f_1 > f_2$, then take some action: i.e. correct the skew for the second DAC(core) by making the skew smaller. If $f_1 < f_2$, then take the opposite action on the second DAC (core). Hence, at 412, DAC (core) clock signals may be delayed in response to the cross-correlation between comparator output and input to the DAC or DAC core calculated at 410, such as through the use of a capacitive DAC (112) coupled to an output of the DAC or each DAC core. Additionally or alternatively, at 414, QMC functionality, QDC functionality, or the like, may be employed to correct detected, and the resulting calculated, skew of the DAC, such as through feedback of detected and calculated skew of the DAC from the digital engine to digital word generation (106, 206) (and/or digital signal source (104, 204)).

FIG. 5 is a graph of an example of Spurious-Free Dynamic Range (SFDR) over a number of calibration cycles, in accordance to some embodiments of the present systems and methods, in a four-way interleaved DAC device (IC) that outputs an approximately FS/8 signal. Therein, the SFDR results for a four-way interleaved DAC IC that outputs an approximately FS/8 signal are graphed over a number of calibration cycles under an embodiment of the present systems and methods. As shown, SFDR improves with time, since skew between the DAC cores is compensated for in accordance with embodiments of the present systems and methods.

FIG. 6 is a graph of an example of SFDR over a number of calibration cycles, in accordance to some embodiments of the present systems and methods in a four-way interleaved DAC device (IC) that outputs an approximately FS/4 signal, with the same skew values as in FIG. 5. Therein, the SFDR is initially much worse than that for the FS/8 case of FIG. 5, but over time, SFDR improves since skew between the cores is again compensated for in accordance with embodiments of the present systems and methods.

FIG. 7 graphs example skew correction values (codes) used for skew correction of a four-way interleaved DAC device, such as may be used by a capacitive clock calibration DAC (112), QMC functionality, QDC functionality, or the like, in accordance with the example results graphed in FIG. 6.

FIG. 8 is a graph of an example of SFDR over a number of calibration iterations, in accordance to some embodiments of the present systems and methods in a DAC device that outputs an approximately FS/8 signal, with an FS/2 spur. Therein, in accordance with embodiments of the present systems and methods, the SFDR improves, as shown.

Many modifications and other embodiments will come to mind to one skilled in the art to which this disclosure pertains having the benefit of the teachings presented in the foregoing descriptions, and the associated drawings. Therefore, it is to be understood that the techniques of this disclosure are not to be limited to the specific embodiments disclosed. Although specific terms are employed herein, they are used in a generic and descriptive sense only and not for purposes of limitation.

What is claimed is:

1. An apparatus comprising:
a digital-to-analog converter;
a comparator operatively coupled to the digital-to-analog converter, the comparator configured to capture properties of an output of the digital-to-analog converter; and
a digital engine operatively coupled to receive an output of the comparator and configured to calculate a cross-correlation between the output of the comparator and an input to the digital-to-analog converter.

2. The apparatus of claim 1, wherein the comparator has a narrow impulse response function relative to an output response of the digital-to-analog converter.

3. The apparatus of claim 1, wherein the digital engine is configured to calculate skew direction information for the output of the digital-to-analog converter.

4. The apparatus of claim 1, wherein the digital-to-analog converter includes a plurality of interleaved digital-to-analog converter cores and the digital engine is configured to determine if a skew of each interleaved digital-to-analog converter core is positive or negative.

5. The apparatus of claim 1, wherein the digital engine is configured to determine if a skew of the digital-to-analog converter is positive or negative relative to a reference point.

6. The apparatus of claim 1, wherein the digital engine is configured to determine if a skew correction term for the digital-to-analog converter should be decreased or increased, based on a skew of the digital-to-analog converter being positive or negative, respectively.

7. The apparatus of claim 1, wherein a clock frequency for the comparator is provided by a full scale clock of the apparatus.

8. The apparatus of claim 1, wherein the digital-to-analog converter includes a plurality of interleaved digital-to-analog converter cores and clock frequency sampling edges of a comparator clock alternate between clock edges of each of the interleaved digital-to-analog converter cores.

9. The apparatus of claim 1, further comprising a capacitive digital-to-analog converter configured to correct digital-to-analog converter output skew by delaying digital-to-analog converter clock signals in response to a calculated cross-correlation between the output of the comparator and the input to the digital-to-analog converter, or further comprising digital correction through feedback from the digital engine to digital input to the digital-to-analog converter reflecting calculated cross-correlation between the output of the comparator and the input to the digital-to-analog converter.

10. A method comprising:
capturing, by a comparator coupled a digital-to-analog converter, properties of an output of the digital-to-analog converter;
receiving, by a digital engine coupled to the comparator, an output of the comparator; and
calculating, by the digital engine, a cross-correlation between the output of the comparator and an input to the digital-to-analog converter.

11. The method of claim 10, wherein calculating the cross-correlation between the output of the comparator and the input to the digital-to-analog converter comprises calculating skew direction information for the output of the digital-to-analog converter.

12. The method of claim 10, wherein the digital-to-analog converter includes a plurality of interleaved digital-to-analog converter cores, and the comparator is operatively coupled to outputs of the plurality of interleaved digital-to-analog converter cores, and calculating, by the digital engine, the cross-correlation between the output of the comparator and the input to the digital-to-analog converter comprises calculating a cross-correlation between an output of the comparator for each of the interleaved digital-to-analog converter cores and a respective input to each of the interleaved digital-to-analog converter cores and determining if a skew of each interleaved digital-to-analog converter core is positive or negative.

13. The method of claim 12, wherein determining if the skew of each interleaved digital-to-analog converter core is positive or negative includes determining the skew of each interleaved digital-to-analog core relative to a reference point.

14. The method of claim 12, further comprising determining if a skew correction term for each digital-to-analog converter core should be decreased or increased, based on the skew of the respective digital-to-analog converter core being positive or negative, respectively.

15. The method of claim 10, further comprising providing a clock frequency for the comparator from a full scale clock provided to the digital-to-analog converter.

16. The method of claim 10, wherein the digital-to-analog converter includes a plurality of interleaved digital-to-analog converter cores and clock frequency sampling edges of a clock of the comparator alternate between clock edges of each of the interleaved digital-to-analog converter cores.

17. The method of claim 10, further comprising correcting digital-to-analog converter output skew, using a capacitive digital-to-analog converter operatively coupled to a clock of the digital-to-analog converter, by delaying digital-to-analog converter core clock signals in response to a calculated cross-correlation between a comparator output and an input to the digital-to-analog converter or digitally correcting a digital input to the digital-to-analog converter in response to the calculated cross-correlation between the comparator output and the input to the digital-to-analog converter.

18. A system comprising:
a digital-to-analog converter;
a digital signal source coupled to the digital-to-analog converter;
a comparator operatively coupled to the digital-to-analog converter, the comparator configured to capture properties of an output of the digital-to-analog converter; and
a digital engine operatively coupled to receive an output of the comparator, configured to monitor an input of the digital-to-analog converter, and configured to calculate a cross-correlation between the output of the comparator and the input to the digital-to-analog converter.

19. The system of claim 18, wherein the digital-to-analog converter comprises a plurality of interleaved digital-to-analog converter cores and the digital engine is configured to determine if a skew of each interleaved digital-to-analog converter core is positive or negative and to determine if a skew correction term for each interleaved digital-to-analog converter core should be decreased or increased, based on the skew of each digital-to-analog converter core being positive or negative, respectively.

20. The system of claim 18, wherein the digital-to-analog converter comprises a plurality of interleaved digital-to-analog converter cores and clock frequency sampling edges of a clock of the comparator alternate between clock edges of each of the interleaved digital-to-analog converter cores.

* * * * *